(12) United States Patent
Tsironis

(10) Patent No.: US 7,646,267 B1
(45) Date of Patent: Jan. 12, 2010

(54) LOW FREQUENCY ELECTRO-MECHANICAL IMPEDANCE TUNER

(75) Inventor: Christos Tsironis, 1603 St-Regis, D.D.O., Quebec (CA) H9B 3H7

(73) Assignee: Christos Tsironis, Kirkland, Quebec (CA)

( * ) Notice: Subject to any disclaimer, the term of this patent is extended or adjusted under 35 U.S.C. 154(b) by 765 days.

(21) Appl. No.: 11/151,419

(22) Filed: Jun. 14, 2005

(51) Int. Cl.
*H03H 7/38* (2006.01)
*G01R 27/00* (2006.01)

(52) U.S. Cl. ..................................... 333/263; 333/17.3
(58) Field of Classification Search .................. 333/33, 333/263, 17.3
See application file for complete search history.

(56) References Cited

U.S. PATENT DOCUMENTS

| | | | | |
|---|---|---|---|---|
| 4,262,266 A | * | 4/1981 | Chern | 333/33 |
| 5,195,045 A | * | 3/1993 | Keane et al. | 702/107 |
| 5,771,026 A | * | 6/1998 | Stengel, Jr. | 343/858 |
| 6,297,649 B1 | * | 10/2001 | Tsironis | 324/642 |
| 6,466,180 B2 | * | 10/2002 | Stengel, Jr. | 343/850 |

OTHER PUBLICATIONS

ADS, Advanced Design System, Agilent Technologies, Jun. 10, 2005.
Microwave Office 2004—Design Suite.
Application Note #15—Focus Microwaves, Jan. 1995.

* cited by examiner

*Primary Examiner*—Stephen E Jones

(57) ABSTRACT

A segmented, electro-mechanical, remotely controlled programmable impedance tuner for the frequency range between 10 and 200 MHz uses a cascade of three continuously variable mechanical capacitors interconnected by a set of two low loss flexible or semi-rigid cables; the electrical length of the interconnecting cables between the capacitors determines the frequency at which tuning coverage of the entire area of the Smith chart is optimum; for maximum impedance coverage the length is to be chosen such as to generate a transmission phase shift of 60 degrees at the center frequency between each capacitor stage. Remote tuning is possible by changing the value of the capacitors using electrical stepper motors. The tuner is calibrated using a vector network analyzer and the data are saved in the memory of the control computer, which then allows tuning to any user defined impedance within the tuning range. Reflection factor values between 0 and higher than 0.9 can be obtained using this tuner.

4 Claims, 16 Drawing Sheets

Low frequency remotely controlled electro-mechanical impedance tuner using three variable capacitors.

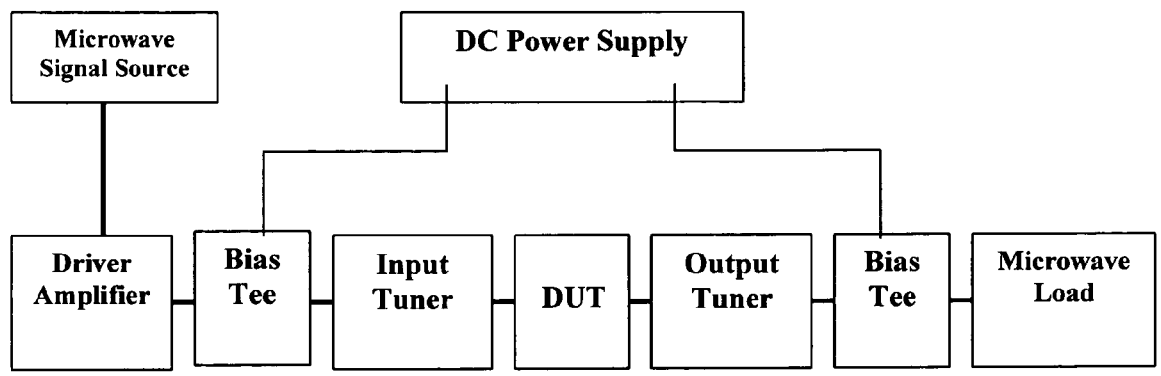
Figure 1: Prior Art: Load Pull measurement setup using two slide-screw Tuners and two Bias Tees

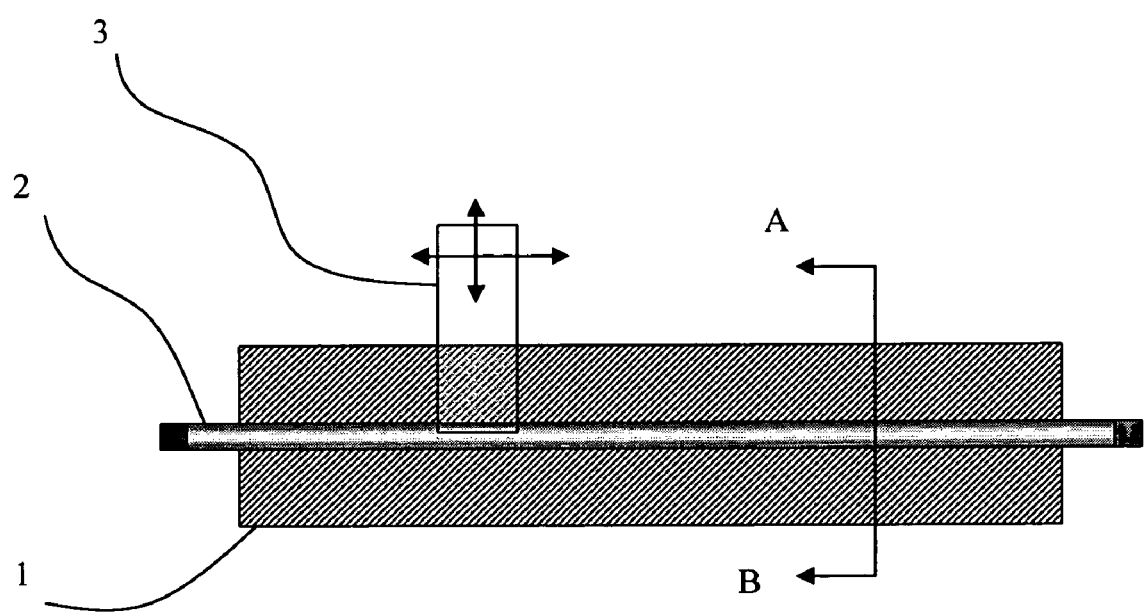
FIG: 2: Prior Art: Side view of cross section of a slide screw impedance tuner

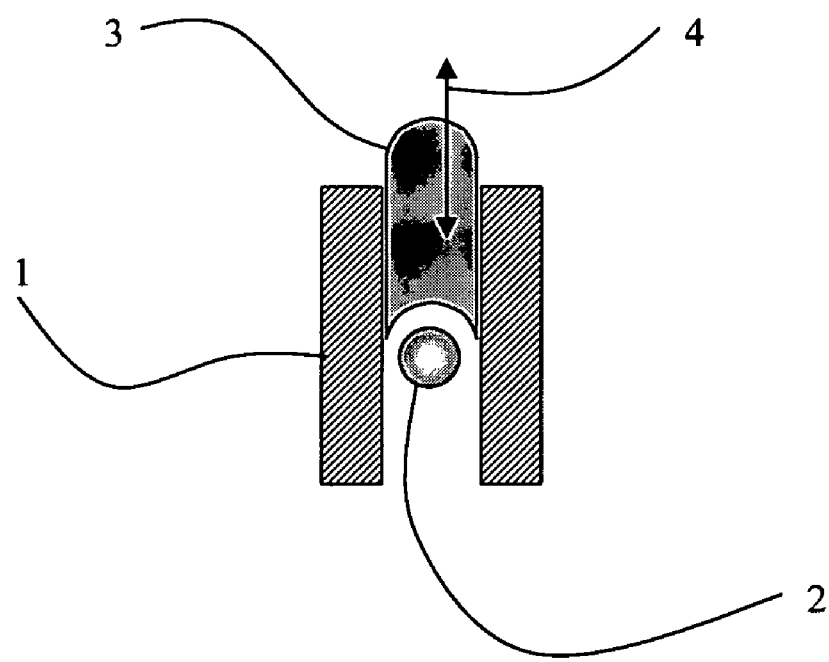
FIG: 3: Prior Art: Cross section A-B (FIG. 1) of a transmission line and insertable probe of a slide screw tuner

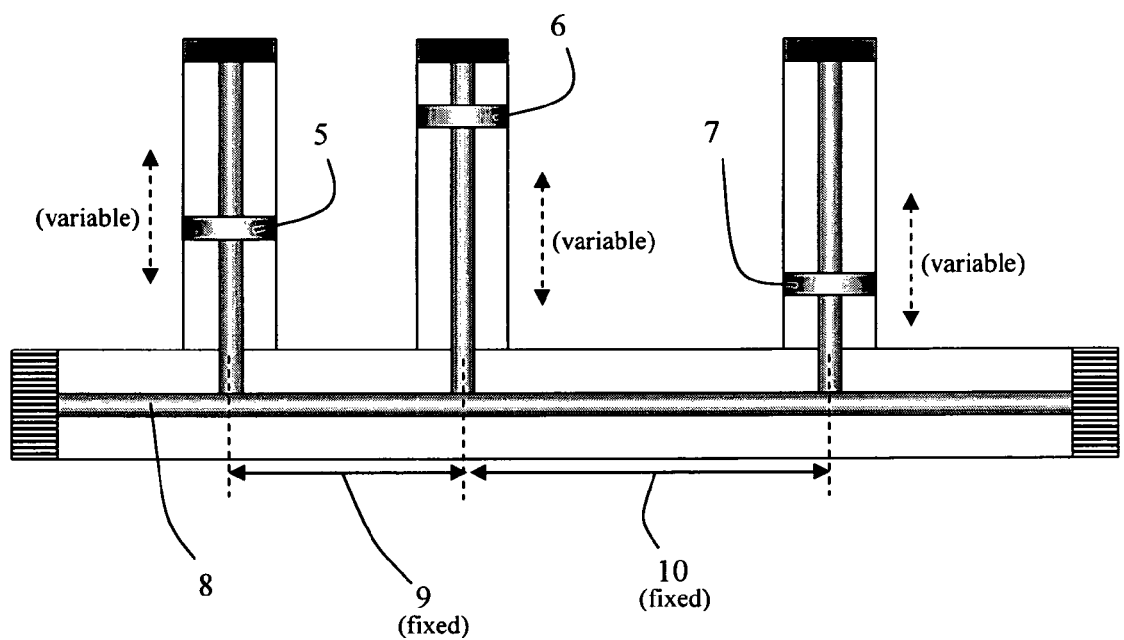
FIG. 4: Prior Art: Side view and cross section of triple stub tuner

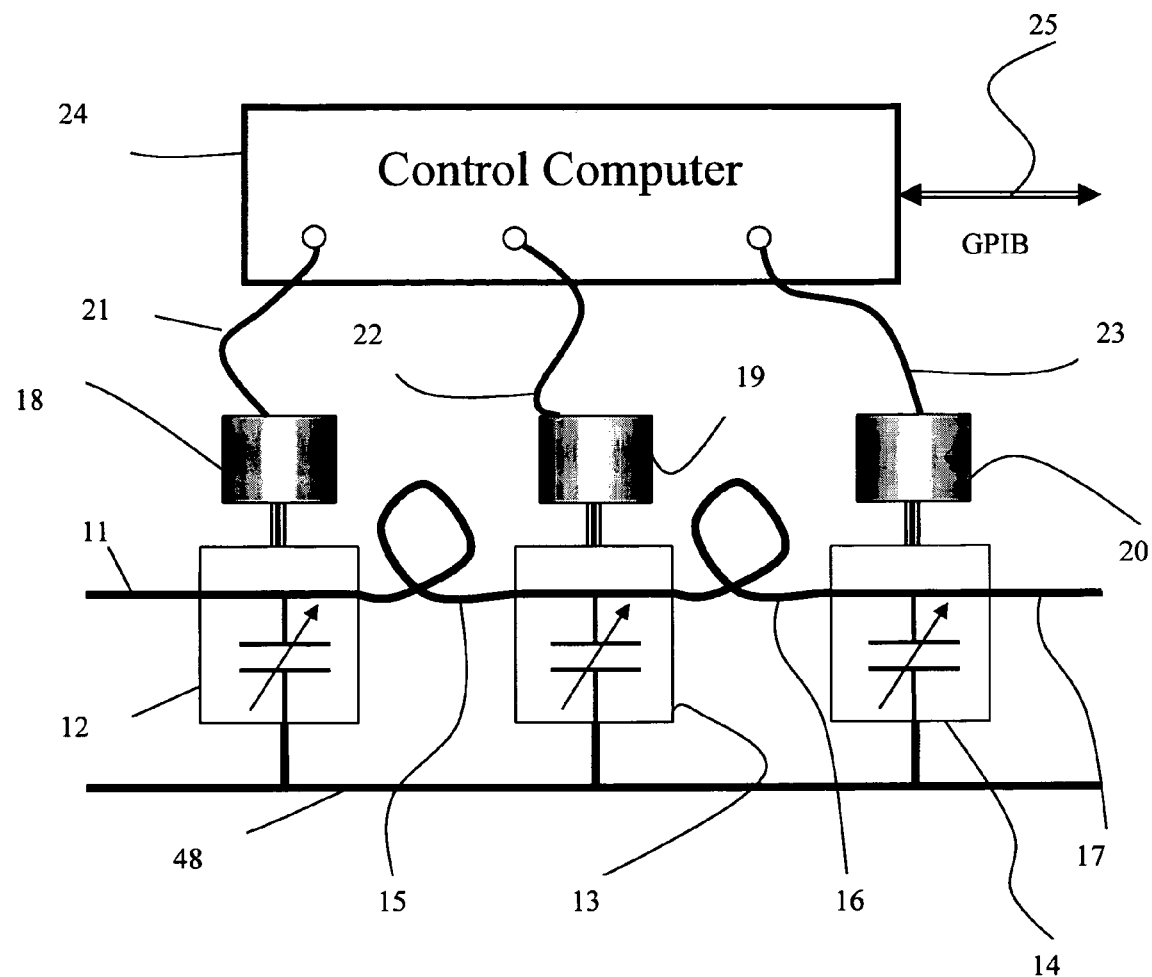
FIG. 5: Low frequency remotely controlled electro-mechanical impedance tuner using three variable capacitors.

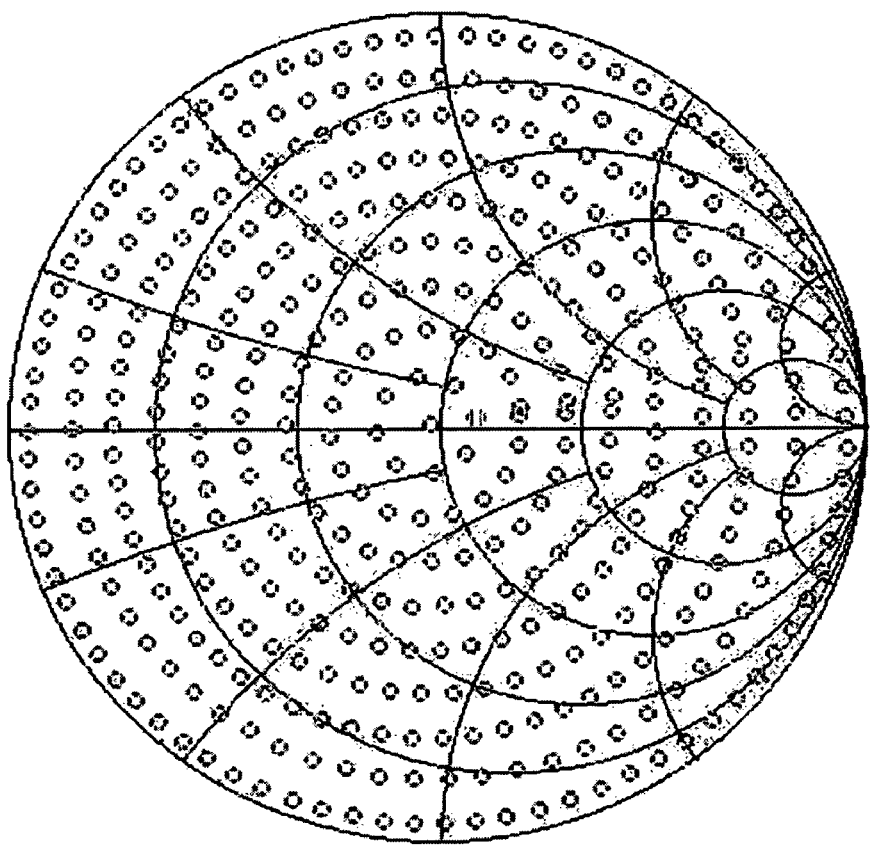
FIG. 6: Prior Art: Distribution of calibration points of a slide-screw tuner at any given frequency inside the operation frequency range of the tuner.

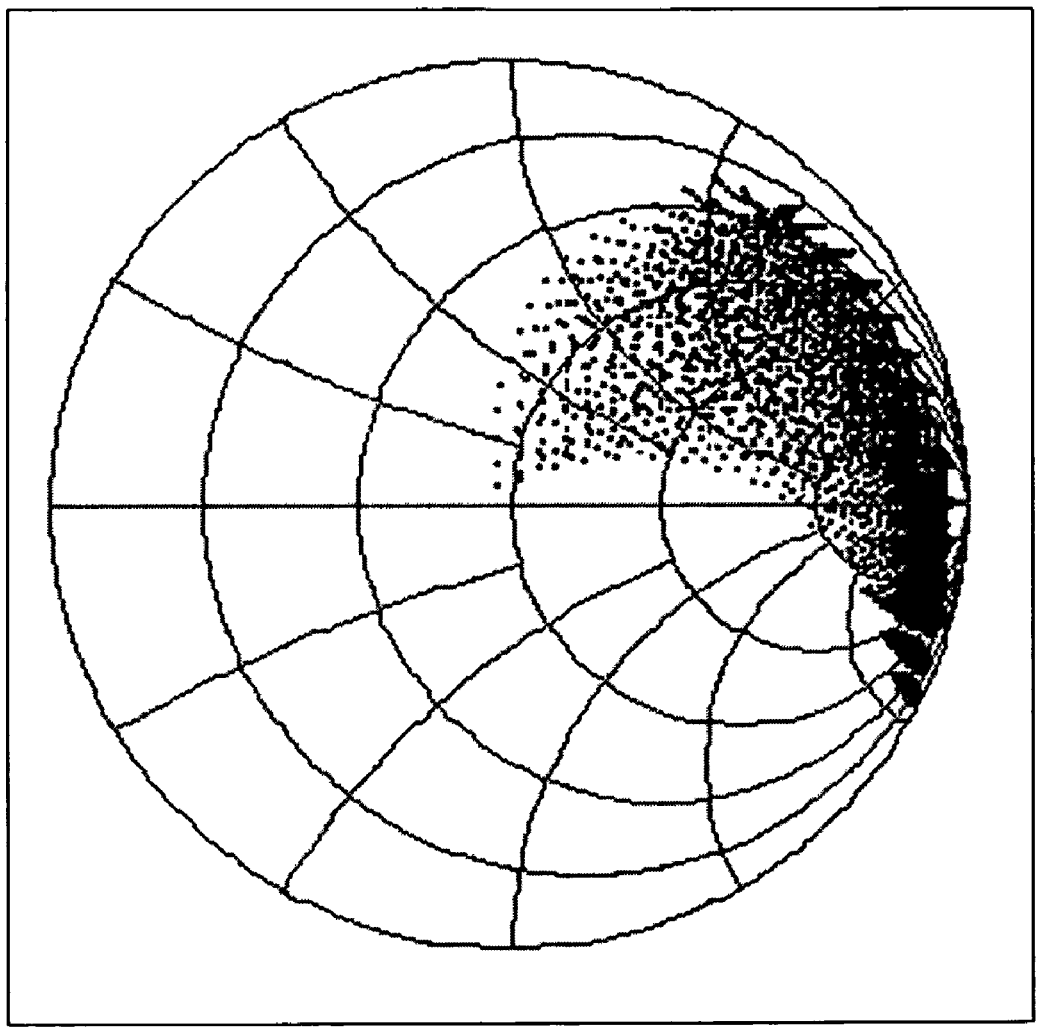
FIG. 7: Tunable impedances of segmented low frequency tuner for a distance between capacitor blocks not equal to optimum λ/6

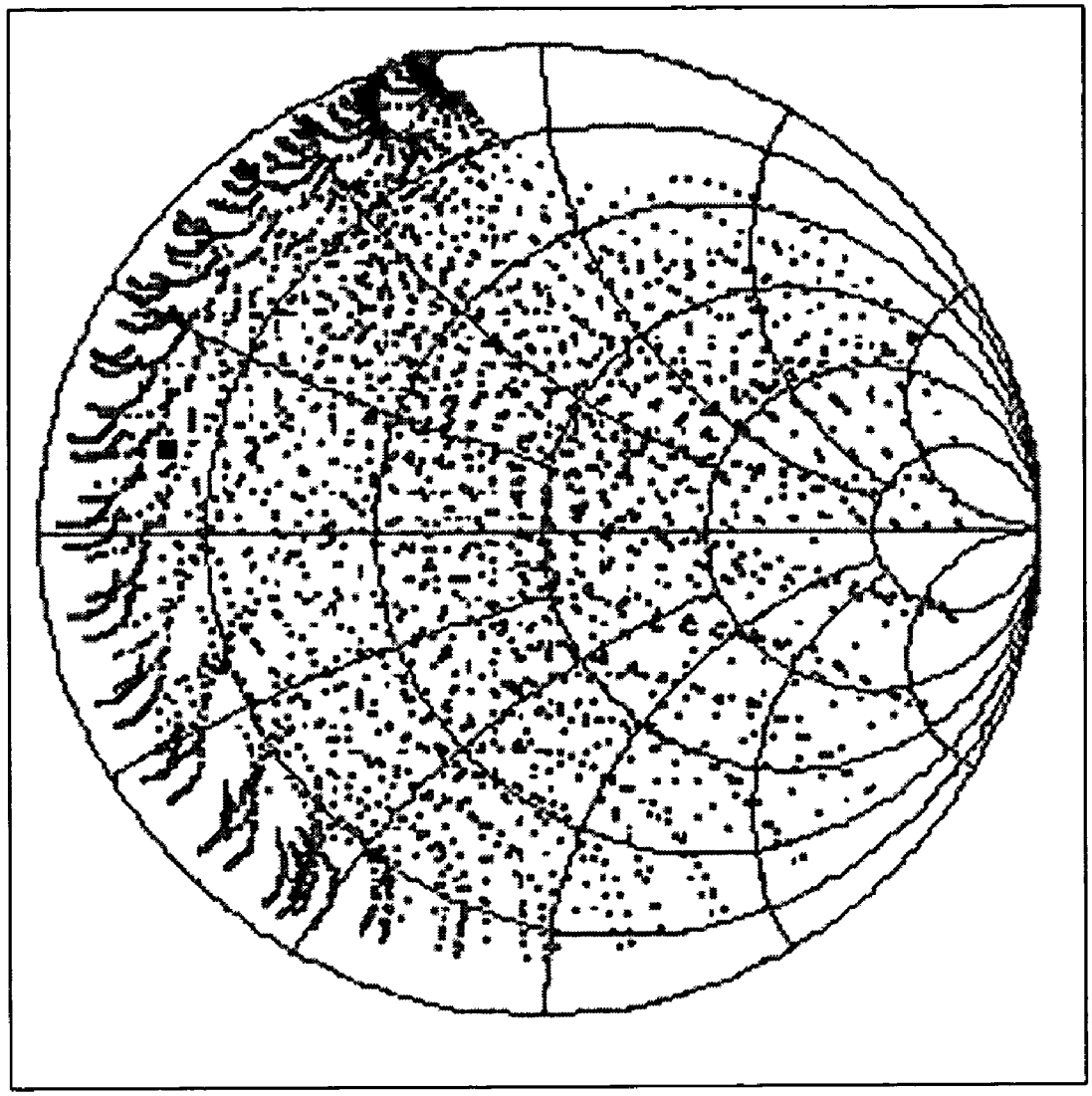
FIG. 8: Tunable impedances of segmented low frequency tuner for a distance between capacitor blocks equal to optimum $\lambda/6$

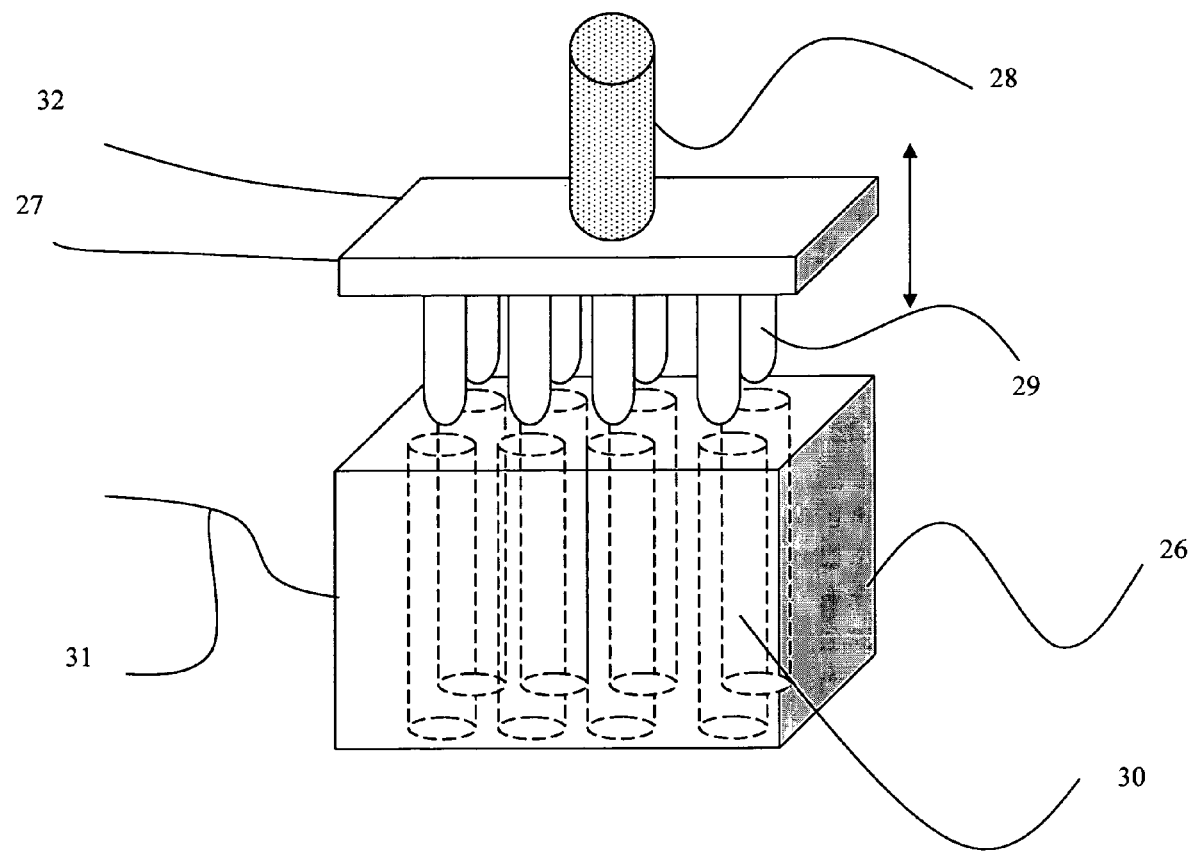
FIG. 9: Prior Art: Remotely controlled variable capacitor using a conductive ground block and vertically insertable conductive stubs.

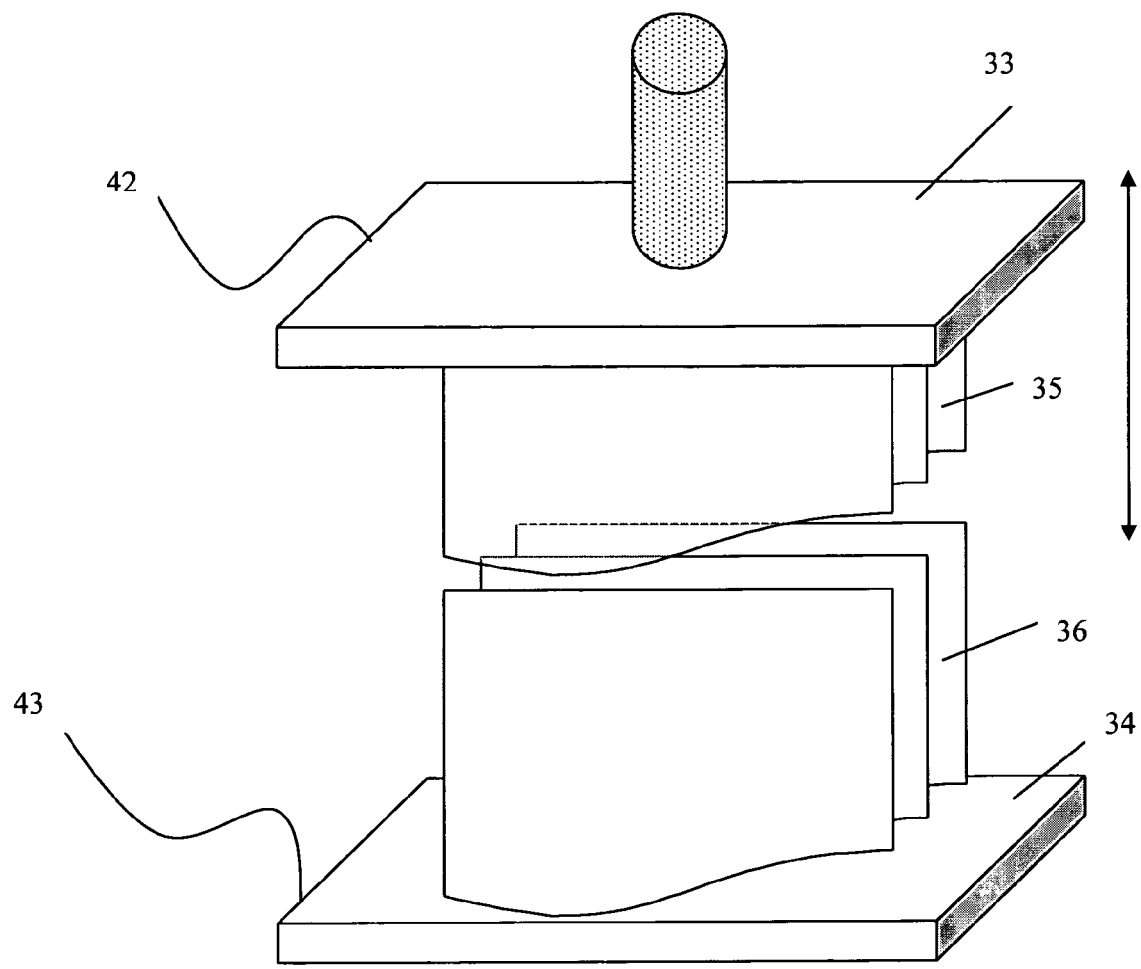
FIG. 10: Prior Art: Remotely controlled variable capacitor using an array of parallel plates

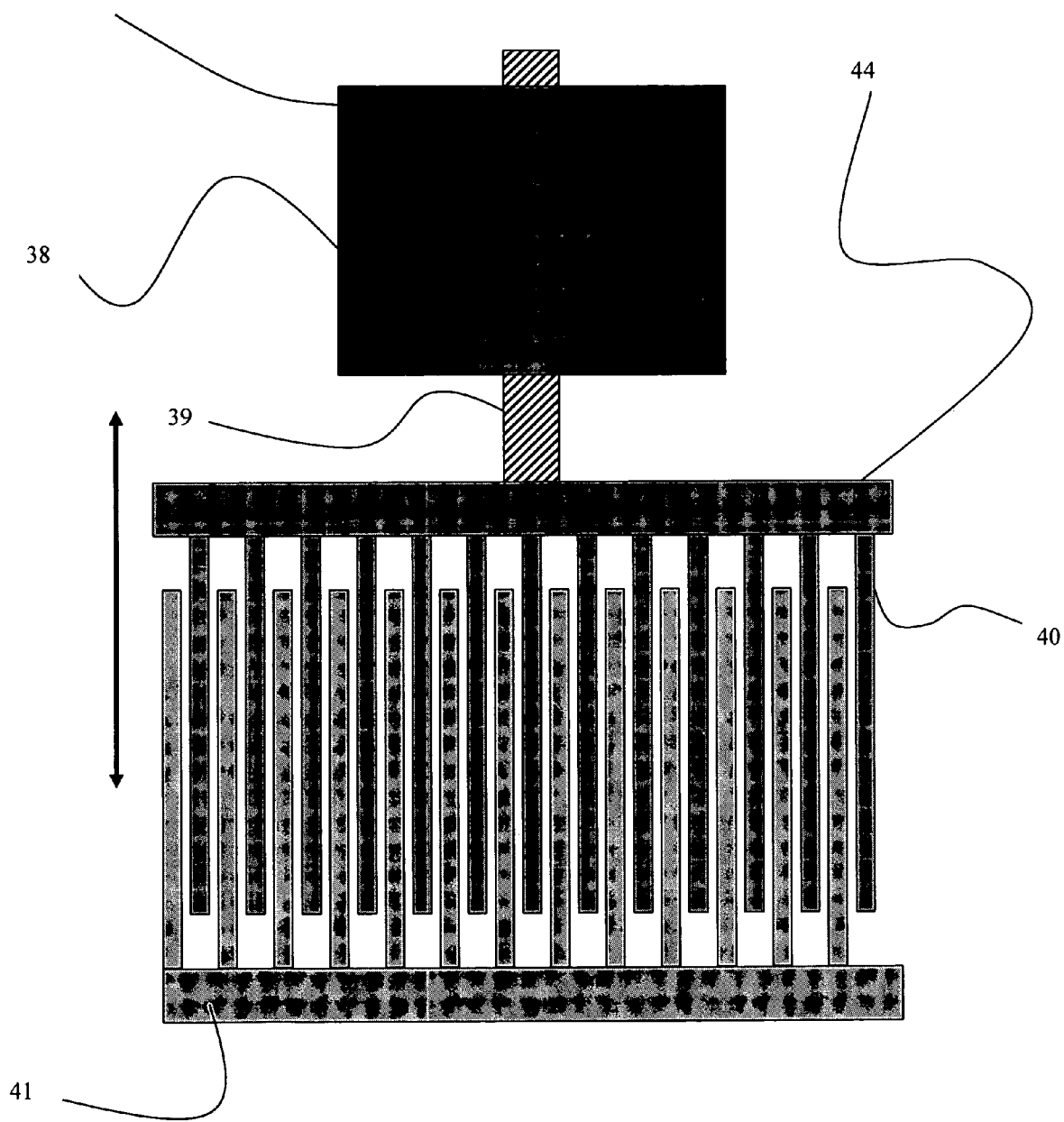
FIG. 11: Partly Prior Art: Cross section of remotely controlled variable capacitor using an array of parallel plates

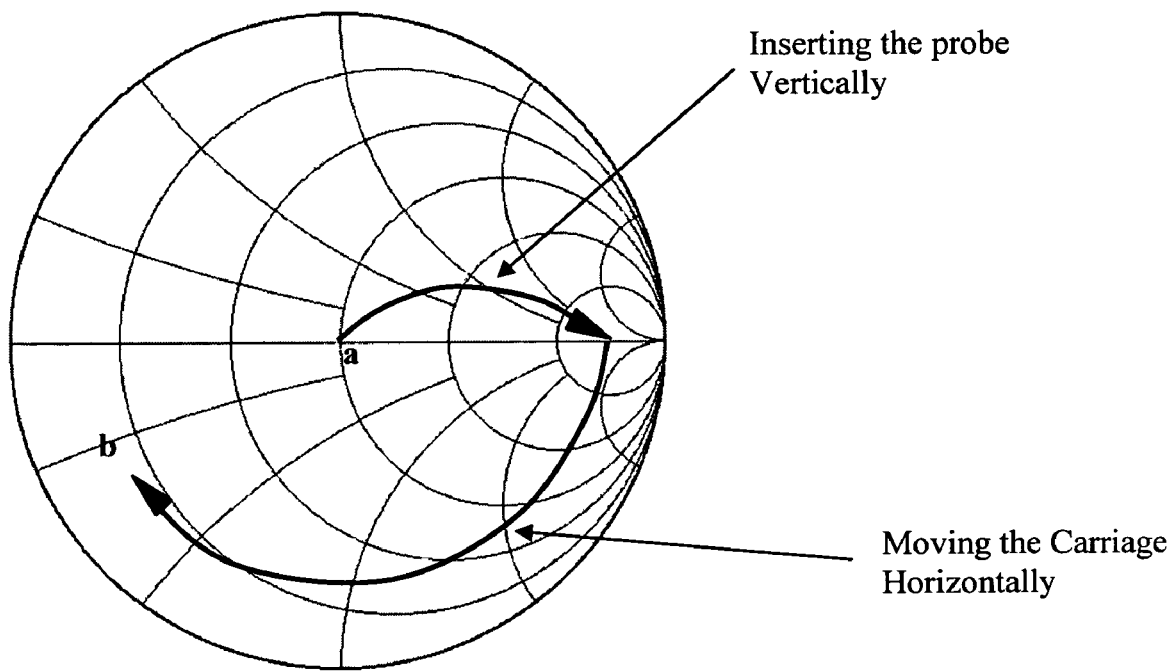
FIG. 12: Prior Art: Tuning mechanism of Slide Screw Tuner

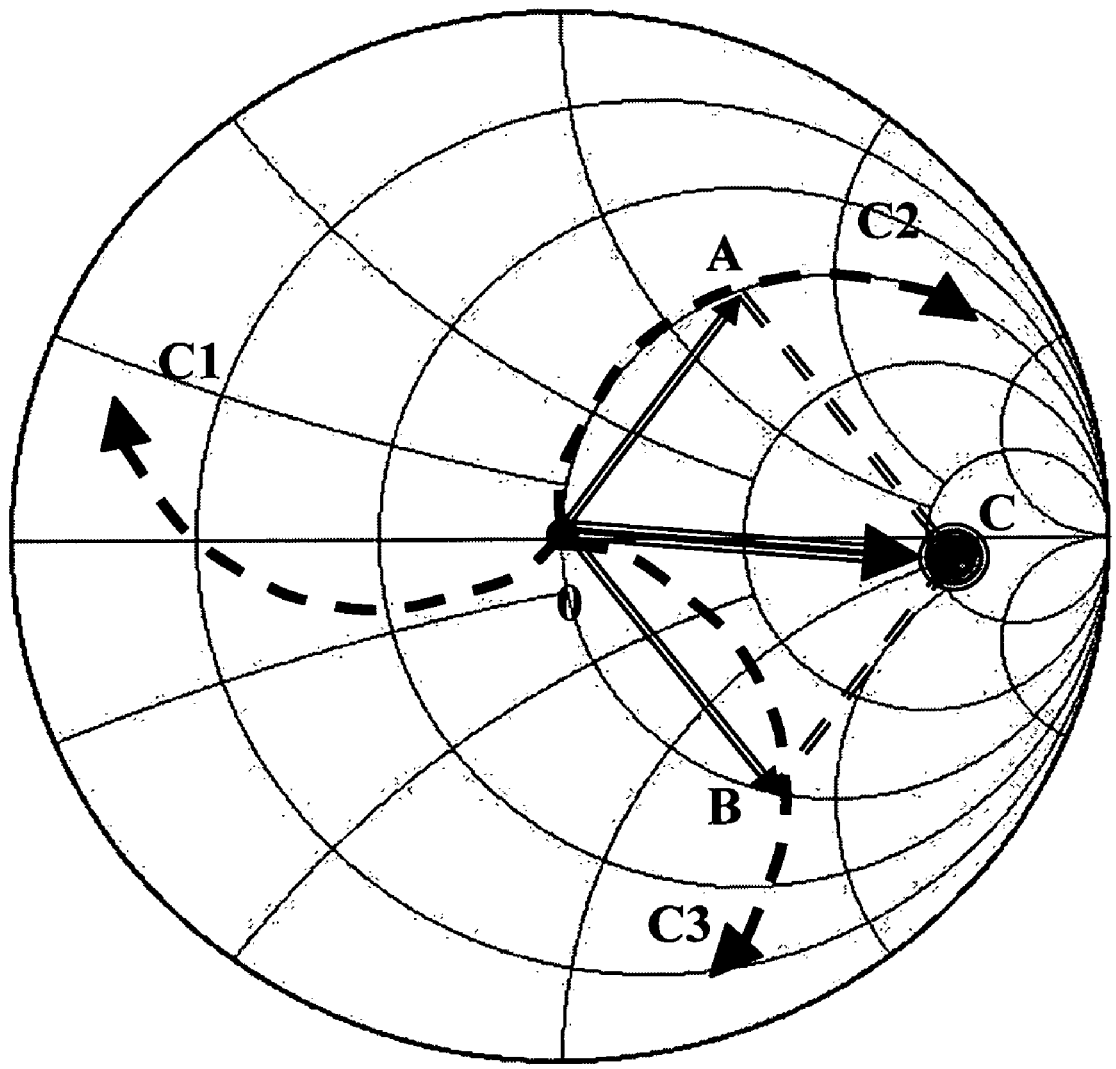
FIG. 13: Tuning mechanism of three probe tuner spaced at λ/6.

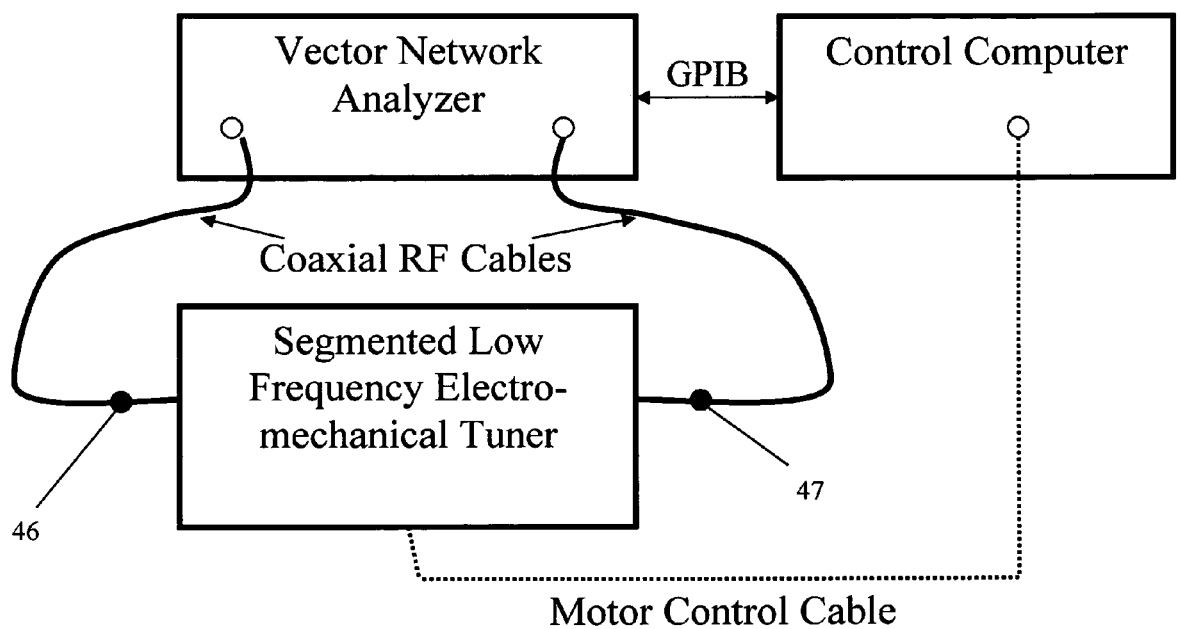
FIG. 14: Setup used to calibrate the segmented impedance tuner using a vector network analyzer

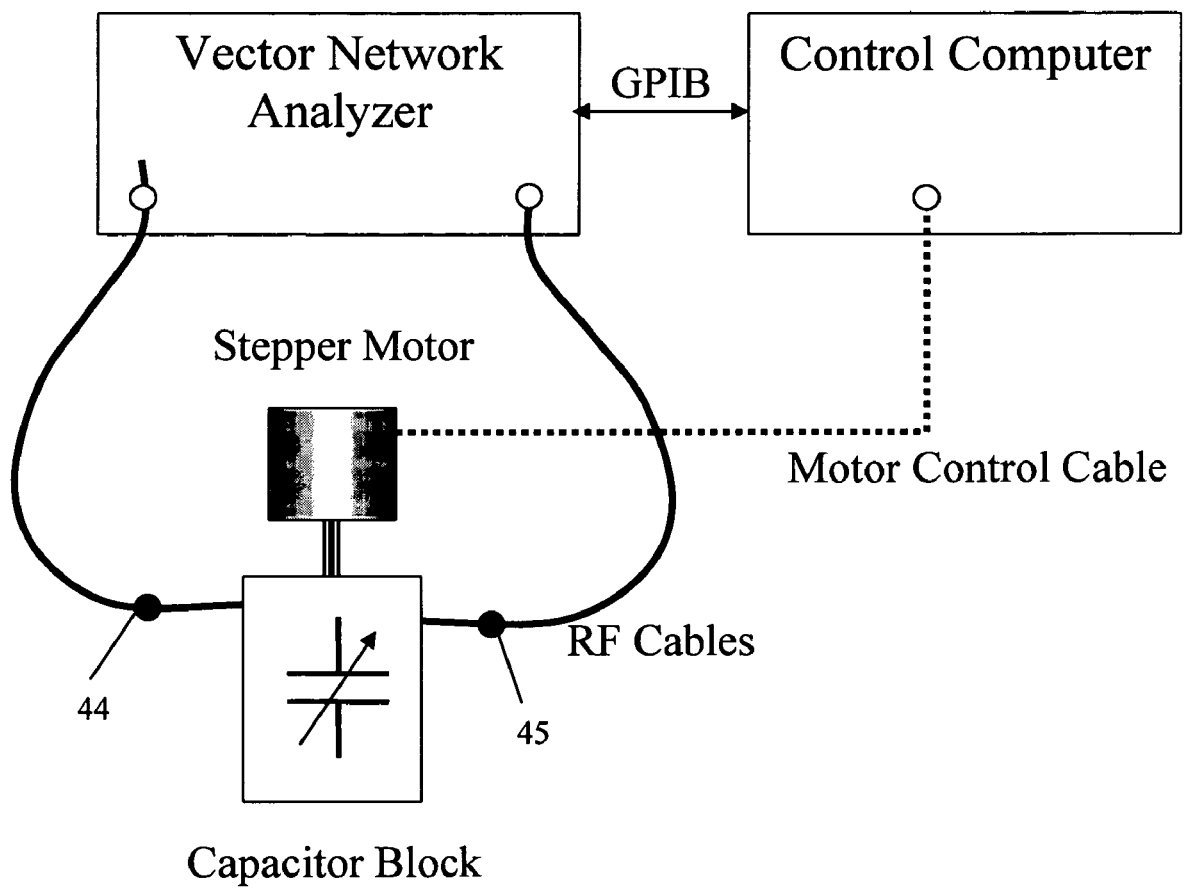
FIG. 15: Setup used to calibrate each capacitor block of the segmented impedance tuner using a vector network analyzer

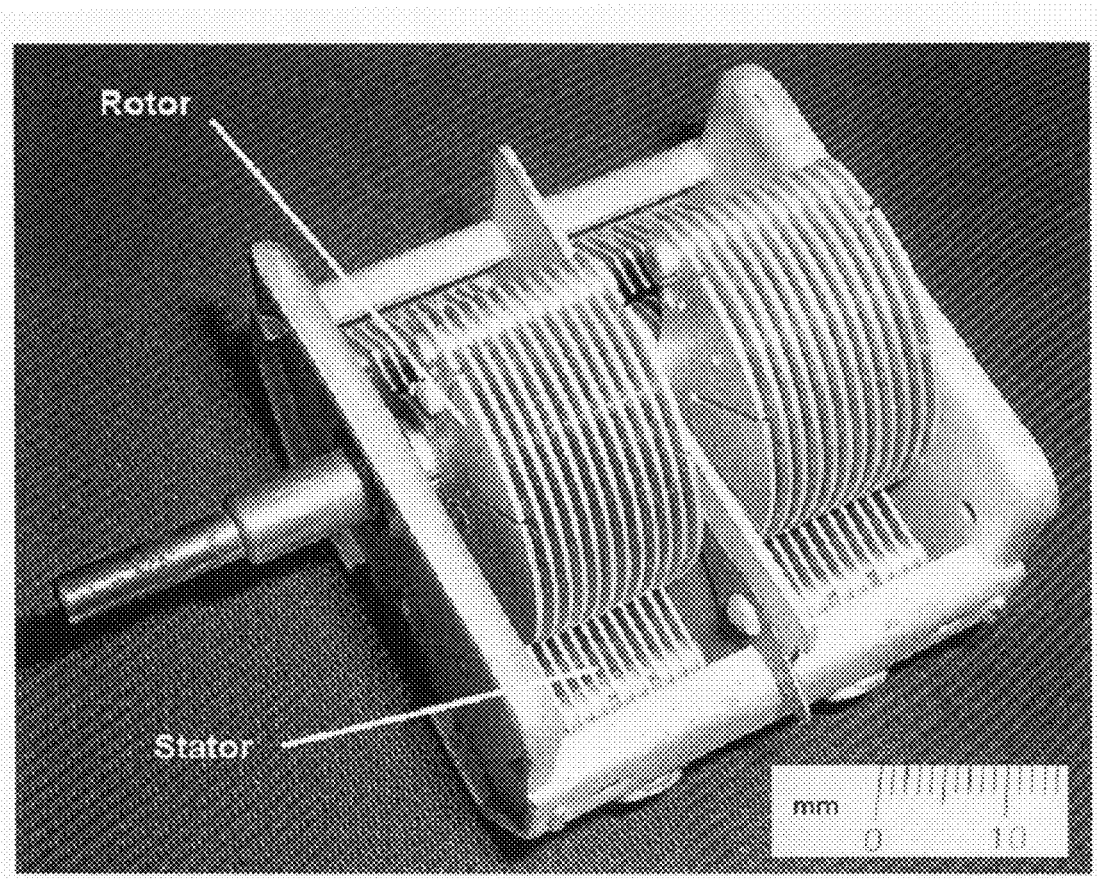
FIGURE 16: Prior art: Commercially available Rotary Capacitor that can be used in the low frequency impedance tuner

LOW FREQUENCY ELECTRO-MECHANICAL IMPEDANCE TUNER

PRIORITY CLAIM

Not Applicable

CROSS-REFERENCE TO RELATED ARTICLES

[1] ADS, Advanced Design System, Agilent Technologies; http://eesof.tm.agilent.com
[2] Microwave Office Microwave Office 2004 Design Suite; http://www.mwoffice.com
[3] "High Resolution Tuners eliminate load pull performance errors", Application Note 15, Focus Microwaves, January 1995
[4] "Computer aided design of microwave circuits", K. C. Gupta et al. Artech ISBN: 0-89006-105-X, Chapter 2.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to RF load and source pull testing of medium and high power RF transistors and amplifiers using remotely controlled electro-mechanical impedance tuners.

Modern design of high power microwave amplifiers and mixers, used in various communication systems, requires accurate knowledge of the active device's (microwave transistor's) characteristics. In such circuits, it is insufficient for the transistors, which operate in their highly non-linear regime, close to power saturation, to be described using non-linear numeric models.

A popular method for testing and characterizing such microwave components (transistors) in the non-linear region of operation is "load pull". Load pull is a measurement technique employing microwave tuners and other microwave test equipment. The microwave tuners are used in order to manipulate the microwave impedance conditions under which the Device Under Test (DUT, or transistor) is tested (FIG. 1); this document refers hence to "impedance tuners", in order to make a clear distinction to "tuned receivers", popularly called elsewhere also "tuners" because of the included tuning circuits.

Impedance tuners consist, in general, of a transmission line and a number of serial or parallel elements, fixed or adjustable, which create a variable reactance, allowing thus the synthesis of various impedances (or reflection factors) covering parts or the totality of the Smith chart (the normalized reflection factor area).

The relation between reflection factor and impedance is given by $\Gamma=(Z-Zo)/(Z+Zo)$, where Z is the complex impedance $Z=R+jX$ and Zo is the characteristic impedance of the transmission line itself.

A number of techniques have been used in the past to manufacture such tuners; one technique is the "slide-screw" tuner (FIGS. 2 and 3) consisting of a slotted transmission airline (1, 2) in which a plunger (or probe, or slug) (3) can be inserted vertically, either manually or remotely, and creates a variable capacitive load and thus a reflection vector at any given frequency. Moving the probe (3) closer (4) to the central conductor (2) increases the capacitive load and thus the magnitude of the reflection factor. Moving the probe along the airline (1) changes the phase of the reflection factor. For a 360 degrees phase change a horizontal travel distance of one half of a wavelength ($\lambda/2$) is required, which determines the total length of the tuner. For such a tuner to operate at 1 GHz a total free travel length of 150 mm is needed, for 100 MHz this length is 1,500 mm (or 1.5 meters). For lower frequencies the required length and thus the size of the tuner becomes even un-handier (3 meters for 50 MHz, 4.5 meters for 33 MHz and so on.) and practically impossible to manufacture in one piece. In view of the required precision of such a tuner these sizes are prohibitive.

One major advantage of slide-screw tuners is the fact that the capacitive loads (3) used have "low-pass" behavior, meaning that at low frequencies they are transparent and do not create any noticeable reflection factor. Typical transistors having higher gain at low frequencies have the tendency to generate spurious oscillations when presented with high reflection factors at these frequencies. Slide screw tuners are therefore the best impedance tuners for testing such oscillation-prone devices under test (DUT's).

Another technique used is the "multi-stub" tuner (FIG. 4). In this case a number of typically three shorted parallel stubs (5, 6, 7) are used connected to a coaxial transmission airline (8) at fixed distances (9, 10). Changing the position of the shorts (5, 6, 7) inside each parallel stub, manually or remotely, creates a variable reactance, which can be capacitive or inductive, depending on the length of the stub, and creates an adjustable reflection factor at the test port of the tuner. Again, the distance (9,10) between the stubs being fixed, the frequency coverage of these tuners is limited; the reason being that, for optimum coverage of the Smith chart, the optimum distance between the stubs must be 120° in reflection (or one sixth of a wavelength, $\lambda/6$). This being the case some manufacturers have used two different lengths (9,10) between stubs, in order to somehow widen the frequency range (FIG. 4). Nevertheless the fact remains that, for optimum coverage, a three stub tuner must be at least $2\times\lambda/6=\lambda/3$ long, in which case all estimates of the previous paragraph apply. At low frequencies the unit becomes big, un-handy and difficult to manufacture; in addition to the fact, that its frequency coverage remains limited and non-adjustable.

A further disadvantage of the multi-stub tuners is the fact that the variable shorts (5,6,7) do not allow DC bias to flow through the tuner in order to bias the DUT; this creates additional DC supply requirements for the test fixture, in which the DUT is embedded (FIG. 1). In addition, a multi-stub tuner requires to insert the bias tees (FIG. 1) between the DUT and tuner, which, in turn, reduces the tuning range, because the bias tees introduce additional insertion loss between the tuner and the DUT.

Further-on the shorted parallel stubs in such tuners do not have the benign "low-pass" behavior of the slide screw tuners, since they represent a high reflection (a "short circuit") at high as well at low frequencies, causing many test devices to oscillate or even fail, in which case the testing becomes impossible.

What is needed, in fact, is a new impedance tuner apparatus, which takes advantage of the slide-screw tuner technology with its variable capacitive loads and the spacing between each load, which is the principle of the parallel-stub tuners.

In this document we propose a new apparatus (FIG. 5), which can operate at low radio frequencies in the range between 10 and 200 MHz; the new apparatus is a fully programmable electro-mechanical tuner, that can be remotely controlled by a control computer and can be calibrated using a vector network analyzer (VNA) and can be driven by a control software to synthesize user defined impedances at a frequency also defined by the user. The apparatus provides the capacity to be optimized for performance and tuning range in the various frequency bands it covers.

The new low frequency tuner consists of a cascade of at least three remotely adjustable variable capacitance blocks connected using lengths of low loss transmission lines, which can be rigid airlines or coaxial flexible or semi-rigid cables (FIG. 5).

BRIEF SUMMARY OF THE INVENTION

This invention describes a radio frequency, computer controlled electro-mechanical impedance tuner apparatus, which is compact in size, easily manufacturable, can be calibrated using standard measurement techniques and allows synthesizing impedances at various frequencies in the range of 10 to 200 MHz.

Hereby the term "synthesizing an impedance" shall not be confused with "tuning" as usually employed when dealing with impedance tuners. The term "impedance synthesis" is used as the process by which a user can select an impedance by entering its real and imaginary part (Z=R+jX) or the equivalent reflection factor $\Gamma=|\Gamma|\cdot\exp(j\Phi)$ into a computer and the computer will be able to direct the impedance tuner to such positions of its tuning elements as to generate (=synthesize) the desired impedance at a given frequency, using previously acquired and properly saved tuner calibration data. This process is far from obvious, since it requires specific calibration techniques, especially for electromechanical tuners as described here, with very high tuning resolution, in which case millions of possible settings are possible and must be considered in the search.

The low frequency tuner described here (FIG. 5) is a segmented apparatus; it consists of a cascade of remotely adjustable capacitors (12,13,14), interconnected using lengths of low loss flexible or semi-rigid cable (11,15,16,17). The variable capacitors are controlled by a computer (24), which drives them to certain positions, measures the scattering parameters (S-parameters) of the tuner on a vector network analyzer (VNA) using a standard GPIB connection (25) and saves them in calibration files, ready to use.

When an impedance synthesis is requested by a user, the computer loads the calibration data from the hard-disk into its active memory and scans through them to find the closest match. After the first step a second search is performed, in which interpolated data between calibration points are used and a final match is found, usually very close or identical within approximately 1% or less of the requested impedance value.

Because of the nature of the variation of the capacitive elements of this tuner and the fact that the electrical distance between these capacitive tuning elements cannot be varied, the coverage of the Smith chart impedance area is not homogenous over a large frequency band (FIGS. 10, 11); contrary to this, in a traditional slide screw tuner (FIG. 2), the pattern of tunable points (FIG. 6) appears the same at all frequencies of the tuner frequency range.

BRIEF DESCRIPTION OF THE SEVERAL VIEWS OF THE DRAWINGS

The invention and its mode of operation will be more clearly understood from the following detailed description when read with the appended drawings in which:

FIG. 1 depicts Prior Art: Load Pull measurement setup using two slide-screw tuners and two bias tees.

FIG. 2 depicts Prior Art: Side view of cross section of a slide screw impedance tuner.

FIG. 3 depicts Prior Art: Cross section A-B (FIG. 1) of a transmission line and insertable probe of a slide screw tuner FIG. 4 depicts Prior Art: A side view and cross section of triple stub tuner.

FIG. 5 depicts a low frequency remotely controlled electro-mechanical impedance tuner using three variable capacitors.

FIG. 6 depicts Prior Art: Distribution of calibration points of a slide-screw tuner at any given frequency inside the operation frequency range of the tuner.

FIG. 7 depicts the tunable impedances of a segmented low frequency tuner for a distance between capacitor blocks not equal to the optimum value of λ/6.

FIG. 8 depicts the tunable impedances of a segmented low frequency tuner for a distance between capacitor blocks equal to the optimum value of λ/6.

FIG. 9 depicts Prior Art: Remotely controlled variable capacitor using a conductive ground block and vertically insertable conductive stubs.

FIG. 10 depicts Prior Art: Remotely controlled variable capacitor using an array of parallel plates.

FIG. 11 depicts Prior Art: Cross section of remotely controlled variable capacitor using an array of parallel plates.

FIG. 12 depicts Prior Art: Tuning mechanism of Slide Screw Tuner.

FIG. 13 depicts the tuning mechanism of a three probe tuner, spaced at λ/6.

FIG. 14 depicts a setup used to calibrate the segmented impedance tuner using a vector network analyzer.

FIG. 15 depicts a setup used to calibrate each capacitor block of the segmented impedance tuner using a vector network analyzer.

FIG. 16 shows a typical rotary capacitor, available commercially; adding several capacitance blocks on the same axis allows higher total maximum capacitance and thus overcomes the limitations at low frequencies, such as 10 or 20 MHz.

DETAILED DESCRIPTION OF THE INVENTION

This invention describes an electro-mechanical impedance tuner that can operate successfully at frequencies as low as 10 MHz and as high as 200 MHz. The reason for the low frequency limit lies in the fact that the required capacitance values are of the order of 2000 pF, a value which is not easily obtainable using mechanically adjustable capacitors with air as a dielectric. If higher value capacitors are available the concept is extendable to lower frequencies as well. Using dielectrically loaded capacitors (for instance with high dielectric oil or dielectric foil between the conductive plates) represents a valuable alternative for very low frequencies; the mechanics of such capacitors may though be prone to intense maintenance and demand expensive manufacturing.

The high frequency limit for this apparatus lies in the fact that the RF cables required to interconnect the capacitance blocks and the interconnections themselves will introduce insertion losses, which will degrade the maximum reflection factor attainable and thus the tuning capability of the apparatus. Even though it is possible to design an impedance tuner also at higher frequencies using the same principle in the Gigahertz range, the practical interest is low.

It has to be said from the beginning that, even though this apparatus can be used over a wide frequency range, it cannot be used at all frequencies at the same time. It can only be re-configured for a frequency range each time by changing the interconnecting cables. Proper circuit simulation techniques help identifying which set of cables will be best for which frequency range and thus sets of such cables must be available for re-configuring the apparatus, before calibrating and using it.

The concept of a segmented tuner is in itself new. It has been known that multi-stub tuners (FIG. 4) can be used to generate reflection factors at low frequencies, though commercial examples have not been known for frequencies below 100 MHz. Multi-stub tuners bear serious disadvantages, such as impossibility to pass DC supply through them and uncontrolled reflections at very low (DC) frequencies, causing most transistors and other devices under test (DUT) to generate spurious oscillations and often fail when being tested using such tuners.

Slide screw tuners instead generate purely capacitive loads, which are transparent to DC bias, meaning that the DUT will be able to be biased using a bias tee connected beyond the tuner itself (FIG. 1); it also means that at very low frequencies the parallel capacitance of the slide screw tuner is transparent to the signal because it creates only a negligible load, thus avoiding spurious oscillations. Since, however, RF probes (slugs) of existing slide screw tuners, because of their mechanically limited size, do not generate enough capacitance to be effective at low frequencies, real multi-section capacitive blocks must be used, as shown in FIGS. 5, 9, 10 and 11.

The present invention uses a set of at least three tuning blocks, which can be identical or slightly different as long as they create enough capacitive load for the frequency of operation, each block comprising an adjustable capacitance connected in parallel to the transmission line and able to create an adjustable reflection at a given reference plane. Interconnecting the three blocks together using lengths of low loss RF cable allows any value of reflection factor amplitude and phase, and thus any impedance, to be generated. The tuning concept is demonstrated in FIG. 13.

The diagram in FIG. 13 shows each of the three adjustable capacitances (12,13,14) to create reflection factors (C1, C2, C3) which change from zero to a maximum value of 0.9 to 0.95, depending on the value of the capacitance and the frequency of operation. The reflection factors increase mostly radially and include a small amount of phase change, towards negative phases, as the capacitance value increases (FIGS. 12, 13).

The length of the interconnecting cables between tuning blocks (15, 16) then allow the reflection factors generated by each of the tuning blocks to be vector-added to each other and create a combination vector between the three of them, as shown in FIG. 13.

Varying only the amplitudes of each of two vectors and keeping the third vector at zero will generate, by vector addition, reflection factors covering a 120° area on the Smith chart (FIG. 13).

The same scheme can be applied to each combination of tuning blocks (12, 14), (12, 13), (13, 14) or all of them (12, 13, 14) at the same time; thus it becomes obvious that the whole area of the Smith chart can be covered with reflection factors created using only three tuning blocks, or three variable capacitances, spaced at 120 degrees (or $\lambda/6$) from each other.

A number of possible capacitor block configurations are shown in FIGS. 9, 10 and 11. They all have in common one grounded (26, 34, 41) terminal and one input/output (floating) (27, 33, 40) terminal. They all have in common some method of movement control of the floating (28, 37, 38, 39) terminals. In our case we prefer stepping motors (38) and precision mechanical gear (39) to control the movement of the floating terminal, for practical reasons: Stepping motors are easy to control digitally and generate very accurate positioning without extra verification components, such as encoders. They are meanwhile the preferred means of control in most precise instrumentation and remotely controlled machinery. The variable capacitor configurations described here can easily generate the capacitance values and capacitance variation required for this tuner to operate.

Typical maximum values of capacitances needed to generate enough reflection are 0 to 20 pF at 1 GHz, 0 to 100 pF at 200 MHz, 0 to 200 pF at 100 MHz, 0 to 600 pF at 30 MHz and 0 to 2000 pF at 10 MHz. Hereby the lowest value of 0 pF is an approximation, since no such capacitor exists. 0 pF here means the minimum value when the capacitor blocks are withdrawn from each-other.

Mechanically adjustable capacitances can be set to minimum values around 0 pF by withdrawing the floating terminal from the grounded one, which is required for the initialization state of this tuner.

However mechanically adjustable capacitance values beyond 100 pF are difficult to manufacture, especially if the dielectric used is air. Using high dielectric oil as a media in the capacitances would make the task of generating a high capacitance easier, but the final apparatus more delicate to handle and operate, since it would have to be sealed for liquids. Using high dielectric liquids and oils, as long as they have very low RF loss, remains, though, a distinct option.

For this purpose various structures of variable capacitances are envisioned without limiting the scope of this invention, such as shown in FIGS. 9 to 11. Earlier used rotary capacitors could also be employed, but their maximum capacitance values are typically restricted to 10 or 20 pF, too low to be used at frequencies below 200 MHz The true advantage of the proposed segmented tuner apparatus lies in the fact that the interconnecting cables between tuning blocks (15, 16) may be ordinary low cost and low loss flexible or semi-rigid cables, which can be configured in coil form to reduce space, because with decreasing frequencies the size of traditional slide screw tuners becomes big, surpassing 1.5 meters or more at 100 MHz. Since size is inversely proportional to frequency, a 10 MHz slide screw tuner would have to be roughly 15 meters long, which of course is prohibitive for this type of application.

Using the segmented tuner concept, such a 10 MHz tuner can be assembled in a space of less that $0.5 \times 0.5$ m$^2$. For higher frequencies the volume of such a tuner becomes progressively smaller.

Calculating the approximate value of a parallel plate capacitance is simple: the formula used is $C = \in \ast Co \ast A/S$; hereby $\in$ is the dielectric constant of the media between the capacitor plates ($\in = 1$ in case of air), Co is the Permittivity of free space (Co=8.85 pF/m), A is the total area of the capacitor plates facing each other and S is the distance between capacitor plates.

Taking an example of a parallel plate capacitor made of 20 plates of 7×7 cm² area (10 plates on each side of the capacitor), spaced at 1 mm from each other, will yield a maximum capacitance of 822 pF approximately (20 plates make for 19 surfaces facing each other) as shown in FIGS. 10 and 11. This means that relatively simple mechanical designs can be used to manufacture such variable capacitances.

The segmented impedance tuner has its highest practical value if it can be used as an independent component and can be directed to "synthesize" RF impedances at will. This can only be achieved if the tuner can be calibrated ahead of time and its calibrations can be used by a control computer and appropriate software to determine the capacitor's settings leading to the requested impedance.

However, before the tuner can be calibrated such as to be able to synthesize impedances in either a certain area of the Smith chart, or covering the whole area of the Smith chart, the appropriate electrical distance between capacitor blocks must be determined. This can be done in two steps: Step one consists in characterizing each block separately and step two consists in assembling the data in a circuit analysis and simulation computer program, which allows modifying numerically the electrical distance between capacitor blocks and simulating numerically the expected impedance coverage on the Smith chart.

The first step though consists in connecting and calibrating each capacitor block on a vector network analyzer (VNA), which has been pre-calibrated at a number of pre-selected frequencies (FIG. 15);

Each capacitor block such as (12), (13) or (14) has an input port, which consists of a through connection of the floating terminals (32, 42, 44) and an output port, which consists of a through connection of the grounded terminals (31, 43, 45). The calibration of each block consists in connecting the input port to the first port (44) of the VNA and the output port to the second port (45) of the VNA. In this configuration the VNA measures scattering parameters (S-parameters) of the capacitance block (or twoport).

During the calibration process the stepper motor is directed by the control computer to lower the plates of the mobile part of the capacitor (FIG. 11) in order to increase the capacitance value, while reading the four scattering parameters (S-parameters) from the VNA using a standard GPIB cable and communication protocol. S-parameters of the capacitor block are measured at typically 10 to 20 positions of the mobile plates between minimum and maximum capacitance values, and saved in a calibration file in the form $Sij(Yi)$; where Yi is the vertical position of the mobile plates (Y=0 corresponds to minimum capacitance, Y=Ymax corresponds to maximum depth and maximum capacitance).

This procedure is repeated for each capacitance block and each frequency of interest and the data are saved in successive calibration files for later use.

In a second step the previously generated block calibration files are loaded into a computer running a, commercially available, network analysis software program, like ADS of Agilent [1] or Microwave Office [2]. There are several such softwares on the market available, some also as freeware. These analysis programs allow cascading the S-parameter files of the capacitor blocks and connecting them numerically with electrical cables of variable length.

These computations generate a new S-parameter matrix in the form Sij (Y1,Y2,Y3), where Y1, Y2, Y3 are the positions of the mobile part of each capacitor. If each capacitor has been calibrated for 20 vertical positions, allowing a close to equal distribution of reflection factor from 0 to maximum (0.9 or 0.95), then the combination S-parameter matrix will include 20×20×20=8,000 calibration points; this is sufficient to be able to tune to any point of the Smith chart, if the electrical lengths of the interconnecting cables are appropriately chosen.

Then all simulated reflection factor points (S11(Y1, Y2, Y3)) of the cascade of three tuning blocks, where Y1, Y2 and Y3 are the positions in the individual tuning blocks, are plotted on the Smith chart at a selected frequency and the operator can decide which combination of electrical length between capacitor blocks is best suited for the specific impedance coverage on the Smith chart he aims (FIGS. 8 and 9).

After the simulation step is finished and optimum lengths of interconnection cables has been found numerically, such a set of cables is selected, if already made or newly manufactured to be as close as possible to the optimum lengths. Subsequently there are two possibilities, which will provide calibration data for the entire tuner. One consists in numerical cascading separately measured data and the other in measuring the entire tuner after assembling it. The first method is faster and uses already measured data of the capacitor blocks and the interconnection cables, whereas the other is lengthier, but more accurate.

In the first case S-parameters of each RF connection cable are measured on the VNA at a number of frequencies. Then the cable data are cascaded in the computer with the S-parameter data of the capacitor blocks, using the network analysis software, and the result is saved in a new tuner calibration file using the format Sij (Y1,Y2,Y3), where Y1 are the motor positions of capacitor block 1, Y2 those of block 2 and Y3 those of block 3. Sij symbolize all four S-parameters {S11, S12, S21, S22} of the tuner twoport. This data can then be used by appropriate impedance synthesis software [3] to direct the three motors such as to generate a requested impedance at a given frequency.

In the second case the tuner is assembled before calibrating it (FIG. 14). In this case all three capacitor blocks are set to zero (minimum capacitance) and the S-parameters Sij(0,0,0) are measured between the input port (46) and the output port (47) using the VNA at a number of frequencies. Subsequently each of the three capacitors alternatively is increased by activating its motor, the other two being held to zero. This yields three sets of S-parameter data in form of Sij(Y1,0,0), Sij(0,Y2,0) and Sij(0,0,Y3).

In order to obtain the S-parameters of the total tuner we must convert the S-parameter data into T-parameters (or ABCD parameters [4]) and cascade as follows:

Sij(Y1,0,0) delivers Tij(Y1,0,0) etc. . . . using well known conversion formulae [4]. Then the total tuner matrix is:

Tij(Y1,Y2,Y3)=Tij(0,0,0)$^{-1}$·Tij(Y1,0,0)·Tij(0,Y2,0)·Tij (0,0,Y3)·Tij(0,0,0)$^{-1}$, whereas the symbol "·" signifies matrix multiplication of two matrices and the symbol "$^{-1}$" signifies the "inverse" matrix.

The T-parameters of the entire tuner are then converted back to S-parameters using well known formulae [4] and the data are saved in the same format Sij(Y1,Y2,Y3) as before. In particular this means that, if we save data for 10 motor positions Yi, for each capacitor block, the total number of saved S-parameter data sets is 10×10×10=1000 sets for each of the three harmonic frequencies. Assuming the data are saved in float format, which require 4 bytes per value, then the 8 components (4 real and 4 imaginary parts) for the 4 S-parameters (S11, S12, S21 and S22) require 3,200 bytes and an additional 20 bytes for the Y values or 3,220 bytes per frequency, or 9,660 bytes for all three frequencies. If 20 motor positions are chosen, in order to increase tuning resolution and accuracy, then the total number of data per set of three harmonic frequencies is twice as large, or 19,320 bytes. This relatively small amount of data, used properly, allows tuning to any point of the Smith chart, if appropriate interpolation routines are used [3].

Impedance synthesis using S-parameters of tuners is a specific procedure related to specific tuners, not commonly known in literature and shall not be elaborated further here. This does not, however, limit the scope of the invention itself, since the invention relates to the apparatus and its calibration rather than the tuning technique and presumes appropriate control software allowing calibration and tuning to be available. The calibration procedure has been laid out briefly only in order to manifest the fact that this tuner has been, in effect, used for impedance synthesis, when calibrated and the calibration data used accordingly.

What I claim as my invention is:

1. An electro-mechanical impedance tuner comprising an input port and an output port and a cascade of three or more capacitance blocks being interconnected using exchangeable lengths of low loss coaxial cable, said capacitances being mechanically adjustable using stepper motors, the total assembly being digitally remotely controlled by a computer, which runs software allowing to synthesize arbitrary, user defined, impedances, in an open loop configuration, based on previously generated tuner calibration data.

2. A tuner as in claim 1, in which said capacitance blocks include one high tuning range rotary capacitor each, which is connected in parallel between a floating point and ground, said floating point serving as connection point between the central conductors of said lengths of coaxial cable between capacitance blocks, each capacitor being driven by an electrical stepper motor, allowing settings between a minimum and a maximum capacitance value in discrete steps, said motor being remotely driven by a digital driver circuit, which receives digital electric control signals from a system computer running appropriate control software.

3. A method for choosing the optimum length of said interconnecting cables between capacitance blocks, as in claim 1, for either optimum coverage of the Smith chart area, or, for focusing the tunable points in other areas, by first measuring the scattering parameters (s-parameters) of each tuning block independently as a function of the values of said capacitance between a minimum and a maximum value and cascading them in the computer using a commercially available microwave circuit analysis program, which allows varying numerically the electrical length of said interconnecting cables between said capacitance blocks and displaying the expected impedance tuning pattern on the Smith chart.

4. A calibration procedure at a frequency $F0$, in which the tuner of claim 1 is connected to a pre-calibrated RF vector network analyzer (VNA) and four scattering (s-) parameters, $S_{11}$, $S_{12}$, $S_{21}$ and $S_{22}$, are measured between the input and output port of said tuner; said calibration procedure consisting of the following steps: in step 1 the s-parameters of said tuner are measured with all capacitors set to their minimum values, the result is saved as a zero matrix $\{S0\}$; in step 2 s-parameters of said tuner are measured when varying the first capacitor in N equal steps between its minimum and maximum values and saved in a matrix $\{S1\}$; in step 3 s-parameters of said tuner are measured when varying the second capacitor in N equal steps between its minimum and maximum values, cascaded with the inverse matrix $\{S0\}^{-1}$ and saved in a matrix $\{S2\}$; in step 4 s-parameters of said tuner are measured when varying the third capacitor in N equal steps between its minimum and maximum values, cascaded with the inverse matrix $\{S0\}^{-1}$ and saved in a matrix $\{S3\}$; in step 5 s-parameter matrices $\{S1\}$, $\{S2\}$ and $\{S3\}$ are cascaded to generate the tuner calibration matrix containing $N^3$ number of s-parameters and saved in a calibration data file, at the frequency $F0$, for later use by the impedance synthesis software.

* * * * *